United States Patent
Gibson

(10) Patent No.: US 10,873,303 B2
(45) Date of Patent: Dec. 22, 2020

(54) AMPLIFIER WITH CONSTANT VOLTAGE GAIN

(71) Applicant: Texas Instruments Incorporated, Dallas, TX (US)

(72) Inventor: Neil Gibson, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/178,090

(22) Filed: Nov. 1, 2018

(65) Prior Publication Data

US 2019/0149111 A1    May 16, 2019

Related U.S. Application Data

(63) Continuation-in-part of application No. 15/809,421, filed on Nov. 10, 2017.

(51) Int. Cl.
*H03F 3/45* (2006.01)
*H03F 1/02* (2006.01)

(52) U.S. Cl.
CPC ....... *H03F 3/45215* (2013.01); *H03F 1/0205* (2013.01); *H03F 3/45475* (2013.01); *H03F 2203/45138* (2013.01); *H03F 2203/45288* (2013.01)

(58) Field of Classification Search
CPC .... H03F 1/0205; H03F 3/45215; H03F 3/193; H03F 2203/45288; H03F 2203/45024; H03F 2203/45138; H03F 3/45; H03F 3/45179; H03F 3/45183; H03F 3/45188; H03F 3/45192; H03F 2200/177; H03F 1/22; H03F 1/223; H03F 2200/294; H03F 2200/372
USPC ........................................ 330/253, 257, 261
See application file for complete search history.

(56) References Cited

U.S. PATENT DOCUMENTS

| | | | | |
|---|---|---|---|---|
| 5,179,354 | A * | 1/1993 | Okamoto | H03F 3/3001 330/253 |
| 5,311,145 | A * | 5/1994 | Huijsing | H03F 3/3028 330/255 |
| 5,699,014 | A | 12/1997 | Haefner et al. | |
| 6,583,665 | B2 * | 6/2003 | Ochi | H03F 3/45183 330/253 |
| 6,664,857 | B2 * | 12/2003 | Ausserlechner | H03F 1/301 330/257 |
| 7,362,173 | B1 * | 4/2008 | Knausz | H03F 3/4521 330/253 |
| 7,443,237 | B1 | 10/2008 | Liu | |
| 7,629,853 | B2 * | 12/2009 | Oishi | H03F 1/223 330/134 |
| 7,746,168 | B2 * | 6/2010 | Oishi | H03F 3/45183 330/252 |

(Continued)

*Primary Examiner* — Khanh V Nguyen
(74) *Attorney, Agent, or Firm* — Ray A. King; Charles A. Brill; Frank D. Cimino

(57) ABSTRACT

An amplifier includes an input stage. The input stage includes a differential pair and a load circuit. The differential pair includes a first transistor and a second transistor. The first transistor and the second transistor are configured to amplify a received differential signal. The load circuit connects the differential pair to a reference voltage. The load circuit is configured to vary in resistance in inverse proportion to the transconductance of the first transistor and the second transistor.

14 Claims, 2 Drawing Sheets

(56) References Cited

U.S. PATENT DOCUMENTS

| | | | | |
|---|---|---|---|---|
| 7,907,011 B2* | 3/2011 | Chung | ................ | H03F 3/45219 |
| | | | | 330/255 |
| 8,890,613 B2* | 11/2014 | Hwang | ............... | H03F 3/45076 |
| | | | | 330/259 |
| 9,143,102 B2* | 9/2015 | Shimomaki | ......... | H03F 3/45219 |
| 2012/0139638 A1* | 6/2012 | Kaviani | .............. | H03F 3/45183 |
| | | | | 330/289 |

* cited by examiner

AMPLIFIER WITH CONSTANT VOLTAGE GAIN

RELATED APPLICATIONS

This application is a continuation-in-part of co-pending U.S. patent application Ser. No. 15/809,421 filed on Nov. 10, 2017, which is fully incorporated herein by reference.

BACKGROUND

Of the many available electronic devices, operational amplifiers (op-amps) are some of the most widely used. Op-amps are efficient and versatile devices that can be used in a variety of applications, such as signal conditioning, analog instrumentation, analog computation, etc. Analog comparators are another frequently used circuit. Op-amps and comparators may be implemented using similar circuitry. For example, op-amps and comparators may employ similar input stage circuitry.

SUMMARY

Electronic devices that include an input stage that provides constant gain independent of device operating current are disclosed herein. In one embodiment, an amplifier includes an input stage. The input stage includes a differential pair and a load circuit. The differential pair includes a first transistor and a second transistor. The first transistor and the second transistor are configured to amplify a received differential signal. The load circuit connects the differential pair to a reference voltage. The load circuit is configured to vary in resistance in inverse proportion to the transconductance of the first transistor and the second transistor.

In another embodiment, an amplifier includes a transconductance device and a load circuit. The transconductance device is configured to apply gain to an input signal. The load circuit is configured to provide a path for flow of current from an output terminal of the transconductance device to a reference voltage, and to produce a constant gain in the transconductance device by varying in resistance in inverse proportion to the transconductance of the transconductance device.

In a further embodiment, an amplifier input circuit includes a first transistor, a second transistor, and a load circuit. The second transistor is coupled to the first transistor to form a differential pair. The load circuit connects the first transistor and the second transistor to a reference voltage. The load circuit is configured to vary in resistance in inverse proportion to the transconductance of the first transistor and the second transistor. The load circuit includes a first variable resistance sub-circuit that connects the first transistor to the reference voltage, and a second variable resistance subcircuit that connects the second transistor to the reference voltage.

BRIEF DESCRIPTION OF THE DRAWINGS

For a detailed description of various examples, reference will now be made to the accompanying drawings in which.

DETAILED DESCRIPTION

Figure 1:
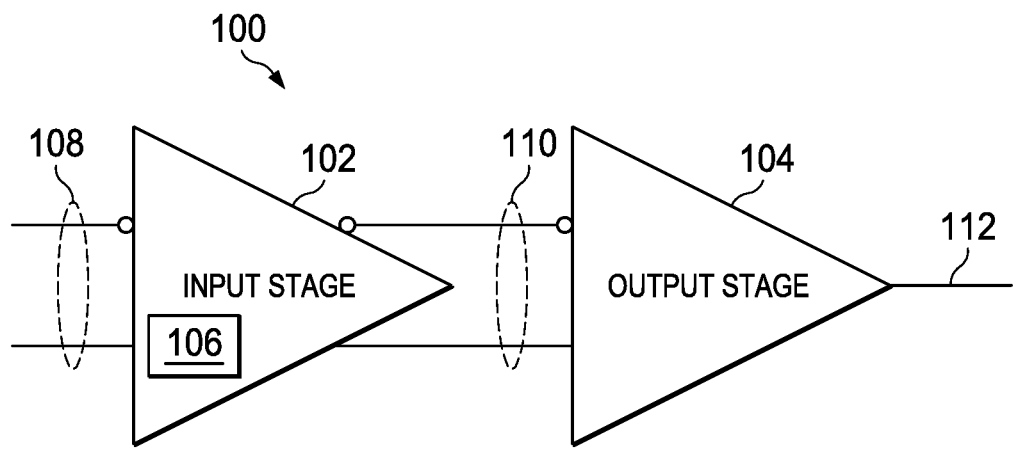
FIG. 1 shows a block diagram of a multistage device that includes a constant gain input stage in accordance with various embodiments.

Certain terms are used throughout the following description and claims to refer to particular system components. As one skilled in the art will appreciate, different parties may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

Electronic circuits, such as operational amplifiers and comparators, are often required to operate across a wide range of "power versus performance." For amplifiers and comparators "power versus performance" is often a function of the current consumed by a circuit and the bandwidth of the circuit. Ideally, "power versus performance" of a circuit is varied without changing other characteristics of the circuit, such as the offset voltage. In amplifiers and comparators, the overall offset voltage is often a function of the offset voltage of the comparator or amplifier's second stage and the gain of the first stage, as well as the first offset voltage of the amplifier or comparator.

In a single gain stage, voltage gain is usually achieved using transconductance and a load resistance. The system requirement of "bandwidth versus supply current" is usually achieved by varying the transconductance of the gain setting devices in the comparator or amplifier. Variance of the transconductance may be achieved by changing the operating bias current of the transconducting circuit elements.

In conventional devices, because load resistance does not scale with the trans-conductance, the voltage gain of the first stage of a comparator or amplifier varies widely with the applied bias current. As a result, the offset voltage of the second stage of the device, when referred to the input of the first stage, varies with the bias current, and may produce significant movement in offset voltage over a change in bias current. The change in offset limits the device by either restricting the magnitude of variation in bias current, or by requiring a reduction in the offset voltage of the device's second stage by increasing second stage device geometry, and as a consequence, reducing operational speed of the second stage. Additionally, in conventional devices, overdrive of the second stage decreases with decreasing bias current (since the gain of the first stage decreases with decreasing bias current) thus slowing the second stage significantly more than would be expected by reduced current in the second stage alone.

Embodiments of the electronic devices disclosed herein include an input stage that provides a voltage gain that is independent of input device transconductance. To establish constant voltage gain over a range of device operating current, embodiments include a load resistance that varies in inverse proportion to the input device's transconductance.

FIG. 1 shows a block diagram of a multi-stage electronic device 100 that includes a constant gain input stage in accordance with various embodiments. The multi-stage electronic device 100 includes an input stage 102 and an output stage 104. Some embodiments of the multi-stage electronic device 100 may include more than two stages. The input stage 102 receives differential input signal 108 and applies gain to the signal 108 to produce differential output signal 110. Differential output signal 110 is received and processed by the output stage 104 to generate output signal 112.

The circuitry and function of the output stage 104 may vary in different embodiments of the device 100. For example, if the device 100 is a comparator, then the output stage 104 may be configured to operate in saturation and include an open collector or open drain output. On the other hand, if the device 100 is an operational amplifier, then the output stage may be configured to produce a linear output voltage.

The input stage 102 provides a constant voltage gain over a range of operating current of the device 100. To enable the constant voltage gain, the input stage 102 includes circuitry 106 that forms a load resistance that varies in inverse proportion to the transconductance of the gain element transistors of the input stage 102. In turn, offset voltage in the output stage 104 does not vary with the bias current applied to set the gain of the input stage 102, which allows the output stage 104 to be implemented with smaller and faster transistors that provide increased operational speed.

Figure 2:
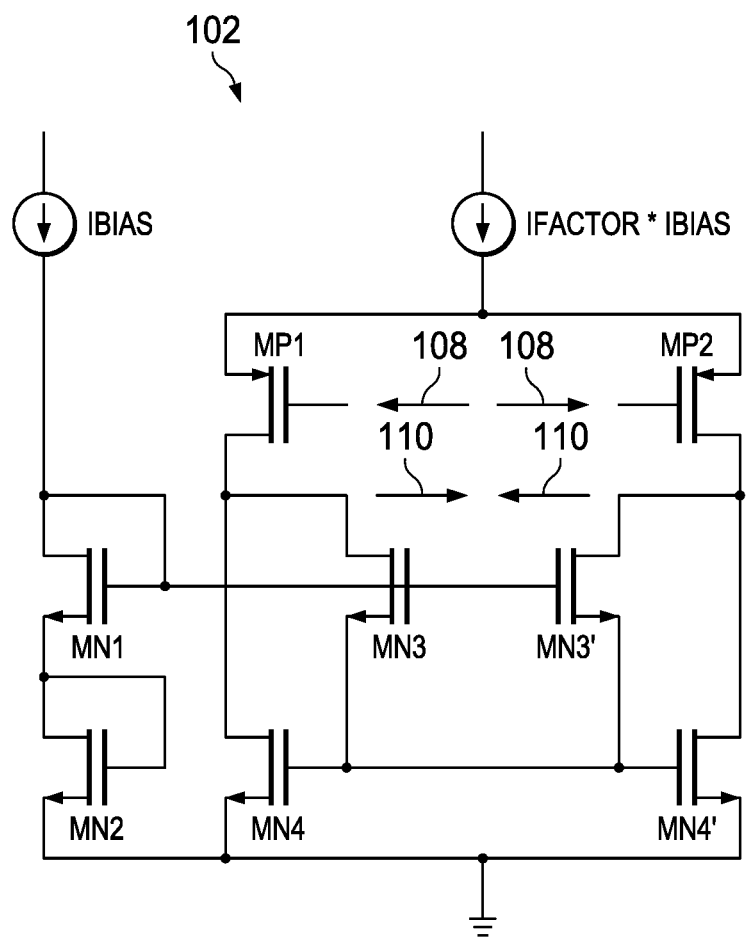
FIG. 2 shows a schematic diagram of differential input stage with constant gain in accordance with various embodiments.

FIG. 2 shows a schematic diagram of the differential input stage 102 with constant gain in accordance with various embodiments. The input stage 102 includes input transistors (i.e., transconductance devices) MP1 and MP2 arranged as a differential pair. Differential input signal 108 is applied to the gate terminals of the input transistors MP1 and MP2, and differential output 110 is taken from the drain terminals of the input transistors MP1 and MP2. The input stage 102 also includes n-channel metal oxide semiconductor field effect (NMOS) transistors MN1, MN2, MN3, MN3', MN4, and MN4' to set the voltage gain of the network. MN3 and MN4 form a subcircuit that connects MP1 to ground. MN3' and MN4' form a subcircuit that connects MP2 to ground. Transistors MN3, MN3', MN4, and MN4' function as load circuit that connects the differential pair to a reference voltage (e.g., ground). Transistors MN1 and MN2 are connected as diodes. While MP1 and MP2 are illustrated as p-channel metal oxide semiconductor field effect (PMOS) transistors, in some embodiments MP1 and MP2 may be bipolar PNP transistors. Some embodiments of the input stage 102 may include NMOS input transistors and PMOS gain setting transistors. The load resistance produced by the gain setting transistors MN1, MN2, MN3, MN3', MN4, and MN4' varies in inverse proportion to the transconductance of the input transistors MP1 and MP2 so that the input transistors MP1 and MP2 provide constant voltage gain over a range of bias currents.

In some embodiments, the transistors MP1 and MP2 have the same physical dimensions (e.g., same channel width and length). Similarly, the transistor MN3' may have the same physical dimensions as the transistor MN3, and/or the transistor MN4' may have the same physical dimensions as the transistor MN4.

Figure 3:
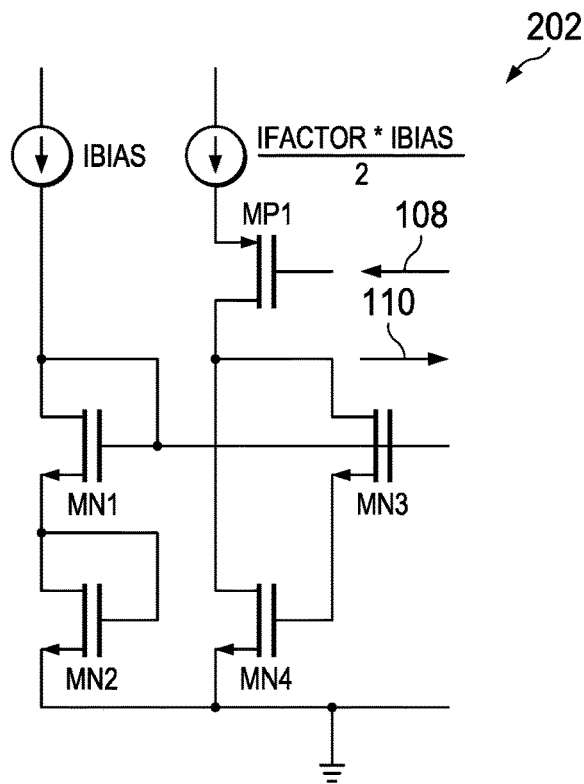
FIG. 3 shows a schematic diagram of a "half circuit" of the differential input stage with constant gain in accordance with various embodiments.

FIG. 3 shows a schematic diagram of a "half circuit" 202 of the differential input stage 102 with constant gain in accordance with various embodiments. The half circuit includes input transistors MP1 and gain setting transistors MN1, MN2, MN3, and MN4 as shown in FIG. 2. In analysis of the half circuit 202, consider all transistors to be operating in the MOS sub-threshold region. Analysis of the half circuit 202 is applicable the full circuit of FIG. 2.

Circuit gain may be expressed as:

$$\text{gain}(gm_{mp1}, gds_{mn3}) = \frac{gm_{mp1}}{gds_{mn3}} \quad (1)$$

where:
$gm_{mp1}$ is the transconductance of transistor MP1; and
$gds_{mn3}$ is the drain-source conductance of the transistor MN3.

Sub-threshold operation of the transistors can be approximated as:

$$I_{DP}(I_{op}, W_p, L_p, K_{gate}, V_{gs}, V_{Th}, V_{ds}) = \quad (2)$$
$$I_{op} * \frac{W_p}{L_p} * \exp\left(\frac{K_{gate} * V_{gs}}{V_{Th}}\right) * \left(1 - \exp\left(\frac{V_{ds}}{V_{Th}}\right)\right)$$

where:
$I_{DP}$ is drain current;
$I_{op}$ is a device constant with units of amperes;
$W_p$ is channel width;
$L_p$ is channel length;
$K_{gate}$ is the gate coupling coefficient;
$V_{gs}$ is gate-source voltage;
$V_{Th}$ is threshold voltage; and
$V_{ds}$ is drain-source voltage.

Differentiating equation (2) with respect to $V_{gs}$:

$$gm_{DP} = \frac{d}{dV_{gs}} I_{op} * \frac{W_p}{L_p} * \exp\left(\frac{K_{gate} V_{gs}}{V_{Th}}\right) * \left(1 - \exp\left(\frac{-V_{ds}}{V_{Th}}\right)\right) \rightarrow \quad (3)$$
$$-\frac{W_p * I_{op} * K_{gate} * e^{\frac{V_{gs} * K_{gate}}{V_{Th}}} * \left(e^{\frac{V_{ds}}{V_{Th}}} - 1\right)}{L_p * V_{Th}}$$

Re-inserting the drain current equation produces:

$$gm_{DP}(K_{gate}, I_{DP}, V_{Th}) = \frac{K_{gate} * I_{DP}}{V_{Th}} \quad (4)$$

The drain-source conductance of MN3 can be calculated as follows. The gate-source voltage of MN3 can be calculated from the gate-source voltages of MN1, MN2, and MN4, and the gate-source voltages of MN1, MN2, and MN4 can be calculated from device geometry and drain current.

$$V_{gs3}(V_{gs1}, V_{gs2}, V_{gs4}) = V_{gs1} + V_{gs2} - V_{gs4} \quad (5)$$

$$I_{DMN1}(I_{on}, W_1, L_1, K_{gate}, V_{gs1}, V_{Th}, V_{ds1}) = \quad (6)$$
$$I_{on} * \frac{W_1}{L_1} * \exp\left(\frac{K_{gate} V_{gs1}}{V_{Th}}\right) * \left(1 - \exp\left(\frac{-V_{ds1}}{V_{Th}}\right)\right)$$

where:
$I_{DNM1}$ is drain current of transistor MN1;
$I_{op}$ is a device constant with units of amperes;
$W_1$ is channel width of transistor MN1;
$L_1$ is channel length of transistor MN1;

$K_{gate}$ is the gate coupling coefficient;

$V_{gs1}$ is gate-source voltage of transistor MN1;

$V_{Th}$ is threshold voltage; and $V_{ds1}$ is drain-source voltage of transistor MN1.

Because transistor MN1 is connected as a diode, gate voltage is equal to drain voltage, and drain current can be redefined as:

$$I_{DMN1}(I_{on}, W_1, L_1, K_{gate}, V_{gs1}, V_{Th}) = \qquad (7)$$

$$I_{on} * \frac{W_1}{L_1} * \exp\left(\frac{K_{gate} V_{gs1}}{V_{Th}}\right) * \left(1 - \exp\left(\frac{-V_{gs1}}{V_{Th}}\right)\right)$$

Because the gate-source voltage will be much greater than the thermal voltage, the drain current can be further simplified as:

$$I_{on} * \frac{W_1}{L_1} * \exp\left(\frac{K_{gate} V_{gs1}}{V_{Th}}\right) - I_{bias} \xrightarrow{\text{solve, } V_{gs1}} \left(\frac{V_{Th} * \ln\left(\frac{L_1 * I_{bias}}{W_1 * I_{on}}\right)}{K_{gate}}\right) \qquad (8)$$

where:

$I_{bias}$ is bias current flowing in MN1.

Thus, the gate-source voltage of MN1 is:

$$V_{gs1}(I_{on}, W_1, L_1, K_{gate}, I_{bias}, V_{Th}) = \frac{V_{Th} * \ln\left(\frac{L_1 * I_{bias}}{W_1 * I_{on}}\right)}{K_{gate}} \qquad (9)$$

Similarly, the gate-source voltage of MN2 is:

$$V_{gs2}(I_{on}, W_2, L_2, K_{gate}, I_{bias}, V_{Th}) = \frac{V_{Th} * \ln\left(\frac{L_2 * I_{bias}}{W_2 * I_{on}}\right)}{K_{gate}} \qquad (10)$$

where:

$W_2$ is channel width of transistor MN2;

$L_2$ is channel length of transistor MN2; and $V_{gs2}$ is gate-source voltage of transistor MN2.

The gate-source voltage of MN4 is similar with the drain current scaled by a predetermined "factor":

$$V_{gs4}(I_{on}, W_4, L_4, K_{gate}, I_{bias}, V_{Th}, \text{Factor}_{bias}) = \qquad (11)$$

$$\frac{V_{Th} * \ln\left(\frac{L_4 * \frac{I_{bias}}{2} \text{Factor}_{bias}}{W_4 * I_{on}}\right)}{K_{gate}}$$

where:

$W_4$ is channel width of transistor MN4;

$L_4$ is channel length of transistor MN4;

$V_{gs4}$ is gate-source voltage of transistor MN4; and

Factor$_{bias}$ is a predetermined value.

Substituting equations (9), (10), and (11) into equation (5), the gate-source voltage of MN3 ($V_{gs3}$) is:

$$V_{gs3}(I_{on}, K_{gate}, I_{bias}, V_{Th}, \text{Factor}_{bias}, W_1, W_2, W_4, L_1, L_2, L_4) = \qquad (12)$$

$$\frac{V_{Th} * \ln\left(\frac{L_1 I_{bias}}{W_1 I_{on}}\right)}{K_{gate}} + \frac{V_{Th} * \ln\left(\frac{L_2 I_{bias}}{W_2 I_{on}}\right)}{K_{gate}} - \frac{V_{th} * \ln\left(\frac{L_4 * \frac{I_{bias}}{2} \text{Factor}_{bias}}{W_4 I_{on}}\right)}{K_{gate}}$$

$$V_{gs3}(I_{on}, K_{gate}, I_{bias}, V_{Th}, \text{Factor}_{bias}, W_1, W_2, W_4, L_1, L_2, L_4) = \qquad (13)$$

$$\frac{V_{Th} * \ln\left(\frac{\frac{L_2 * I_{bias}}{W_2 * I_{on}} * \frac{L_1 * I_{bias}}{W_1 * I_{on}}}{\frac{L_4 \frac{I_{bias}}{2} * \text{Factor}_{bias}}{W_4 I_{on}}}\right)}{K_{gate}}$$

which simplifies to:

$$V_{gs3}(I_{on}, K_{gate}, I_{bias}, V_{Th}, \text{Factor}_{bias}, W_1, W_2, W_4, L_1, L_2, L_4) = \qquad (14)$$

$$\frac{V_{Th} * \ln\left(\frac{2 * W_4 * L_1 * L_2 * I_{bias}}{W_1 * W_2 * L_4 * I_{on} * \text{Factor}_{bias}}\right)}{K_{gate}}$$

To calculate the resistance of the MN3 channel:

$$I_{DMN3}(I_{on}, W_3, L_3, K_{gate}, V_{gs3}, V_{Th}, V_{ds3}) = \qquad (15)$$

$$I_{on} * \frac{W_3}{L_3} * \exp\left(\frac{K_{gate} * V_{gs3}}{V_{Th}}\right) * \left(1 - \exp\left(\frac{-V_{ds3}}{V_{Th}}\right)\right)$$

where:

$W_3$ is channel width of transistor MN3;

$L_3$ is channel length of transistor MN3; and $V_{ds3}$ is drain-source voltage of transistor MN3.

Equation (15) can be rearranged to find drain source voltage:

$$V_{ds3}(I_{on}, W_3, L_3, K_{gate}, V_{gs3}, V_{Th}, I_{DMN3}) = \qquad (16)$$

$$-\left(V_{th} * \ln\left(1 - \frac{L_3 * I_{DMN3} * e^{-\frac{V_{gs3} K_{gate}}{V_{Th}}}}{W_3 * I_{on}}\right)\right), \text{ and}$$

channel voltage can be differentiated with respect to channel current to produce channel resistance:

$$\frac{d}{dI_{Dmn3}} - \left(V_{Th} * \ln\left(1 - \frac{L_3 * I_{Dmn3} * e^{\frac{V_{GS3} * K_{gate}}{V_{Th}}}}{W_3 * I_{on}}\right)\right) \rightarrow \qquad (17)$$

$$-\frac{L_3 V_{Th} e^{\frac{V_{GS3} * K_{gate}}{V_{Th}}}}{W_3 * I_{on} * \left(\frac{L_3 * I_{Dmn3} * e^{\frac{V_{GS3} * K_{gate}}{V_{Th}}}}{W_3 * I_{on}} - 1\right)}$$

Thus, channel resistance of MN3 ($R_{DS3}$) is determined to be:

$$R_{DS3}(I_{on}, W_3, L_3, K_{gate}, V_{GS3}, V_{Th}, I_{DMN3}) = \qquad (18)$$

-continued $$-\frac{L_3 * V_{Th} * e^{\frac{V_{GS3} * K_{gate}}{V_{Th}}}}{W_3 * I_{on} * \left(\frac{L_3 * I_{DMN3} * e^{\frac{V_{GS3} K_{gate}}{V_{Th}}}}{W_3 * I_{on}} - 1\right)}$$

In the input stage 102, $I_{DMN3}$ is zero:

$$-\frac{L_3 * V_{Th} * e^{\frac{V_{GS3} * K_{gate}}{V_{Th}}}}{W_3 * I_{on} * \left(\frac{L_3 * I_{DMN3} * e^{\frac{V_{GS3} * K_{gate}}{V_{Th}}}}{W_3 * I_{on}} - 1\right)}, \quad (19)$$

$$\text{substitute } I_{DMN3} = 0 \; \frac{L_3 * V_{Th} * e^{\frac{V_{GS3} * K_{gate}}{V_{Th}}}}{W_3 * I_{on}}$$

Accordingly, the channel resistance of MN3 is:

$$R_{DS3}(I_{on}, W_3, L_3, K_{gate}, V_{GS3}, V_{Th}) = \frac{L_3 * V_{Th} * e^{\frac{V_{GS3} * K_{gate}}{V_{Th}}}}{W_3 * I_{on}} \quad (20)$$

Substituting the expression for $V_{gs3}$ (equation (14)) into equation (20):

$$\frac{L_3 * I_{DMN3} * e^{\frac{V_{GS3} K_{gate}}{V_{Th}}}}{W_3 * I_{on}} \text{ substitute,} \quad (21)$$

$$V_{GS3} = \frac{V_{Th} * \ln\left(\frac{2 * W_4 * L_1 * L_2 * I_{bias}}{W_1 * W_2 * L_4 * I_{on} * \text{Factor}_{bias}}\right)}{K_{gate}} \rightarrow$$

$$\frac{W_1 * W_2 * L_3 * L_4 * V_{Th} * \text{Factor}_{bias}}{2 * W_3 * W_4 * L_1 * L_2 * I_{bias}}$$

$$R_{DS3}(W_1, W_2, W_3, L_1, L_2, L_3, L_4, I_{bias}, \text{Factor}_{bias}, V_{Th}) = \quad (22)$$

$$\frac{W_1 * W_2 * L_3 * L_4 * V_{Th} * \text{Factor}_{bias}}{2 * W_3 * W_4 * L_1 * L_2 * I_{bias}}$$

Equation (22) shows that the channel resistance of MN3 is independent of all process constants.

The conductance of the MN3 is:

$$gds_{mn3}(W_1, W_2, W_3, L_1, L_2, L_3, L_4, I_{bias}, \text{Factor}_{bias}, V_{Th}) = \quad (23)$$

$$\frac{1}{R_{DS3}(W_1, W_2, W_3, L_1, L_2, L_3, L_4, I_{bias}, \text{Factor}_{bias}, V_{Th})}$$

The transconductance of transistor MP1 ($gm_{DP}$) is:

$$gm_{DP} = (K_{gateP}, I_{bias}, \text{Factor}_{bias}, V_{Th}) = \frac{K_{gate} * \frac{I_{bias}}{2} * \text{Factor}_{bias}}{V_{Th}} \quad (24)$$

Applying equations (1), (23), and (24), the voltage gain of the input stage 102 is:

$$\text{gain}(W_1, W_2, W_3, L_1, L_2, L_3, L_4, \text{Factor}_{bias}, V_{Th}, K_{gateP}) = \quad (25)$$

-continued $$\frac{W_1 * W_2 * L_3 * L_4 * K_{gateP} * \text{Factor}_{bias}^2}{4 * W_3 * W_4 * L_1 * L_2}$$

where:

$K_{gateP}$ is the gate coupling coefficient of MP1.

Equation (25) shows that the gain of the input stage 102 is a function of only transistor geometry and the gate coupling coefficient of the input transistor MP1, and is therefore constant over a range of bias current.

In some embodiments of the input stage 102, the transistors MP1, MN1, MN2, MN3, and MN4 have the same channel length, and MP1, MN1, MN2, and MN3 have the same channel width (W). In such embodiments, the channel width of the transistor MN4 may be set to $$\frac{W * \text{Factor}_{bias}}{2}.$$

In these embodiments, the gain of the input stage 102 is:

$$\text{gain}(\text{Factor}_{bias}, K_{gateP}) = \frac{K_{gateP} * \text{Factor}_{bias}}{2}. \quad (26)$$

Figure 4:
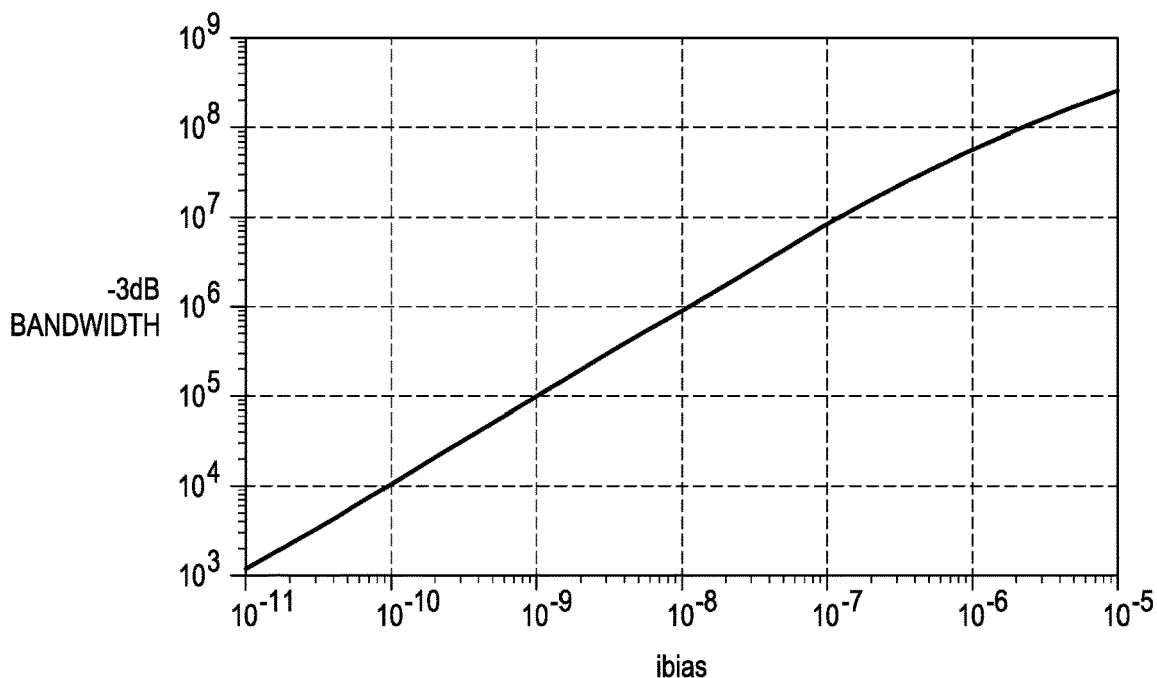
FIG. 4 shows an example of bandwidth versus bias current in a constant gain input stage in accordance with various embodiments.

FIG. 4 shows an example of bandwidth versus bias current of the constant gain input stage 102 in accordance with various embodiments. FIG. 4 shows that, in the input stage 102, bandwidth is directly proportional to bias current over a wide range of currents. For example, in FIG. 4, bandwidth is the input stage 102 is a function of bias current over about six decades of bias current.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An amplifier, comprising:
   an input stage including:
      a differential pair that includes:
         a first transistor; and
         a second transistor; and
      a load circuit including:
         a first sub-circuit connected to the first transistor, the first sub-circuit including:
            a third transistor having a first current terminal and a second current terminal, wherein the first current terminal is connected to a current terminal of the first transistor; and
            a fourth transistor having a current terminal connected to a reference voltage, wherein the second current terminal of the third transistor is connected to a control terminal of the fourth transistor; and
         a second sub-circuit connected to the second transistor, the second sub-circuit including:
            a fifth transistor configured to provide a path for current flow from the second transistor to the reference voltage; and
            a sixth transistor, wherein a current terminal of the fifth transistor is connected to a control terminal of the sixth transistor.

2. The amplifier of claim 1, wherein the load circuit is configured to vary in resistance in inverse proportion to the transconductance of the first transistor and the second transistor.

3. The amplifier of claim 1, including a seventh transistor configured to operate as a diode, wherein a control terminal of the seventh transistor is connected to the control terminal of the third transistor and to a control terminal of the fifth transistor.

4. The amplifier of claim 3, including an eighth transistor configured to operate as a diode, wherein a control terminal of the eighth transistor is connected to a current terminal of the seventh transistor.

5. The amplifier of claim 4, wherein the eighth transistor is connected to provide a path for current flow to the seventh transistor.

6. The amplifier of claim 4 wherein:
the first transistor and the second transistor have same channel dimensions;
the third transistor and the fifth transistor have same channel dimensions; and
the fourth transistor and the sixth transistor have same channel dimensions.

7. An amplifier, comprising:
a transconductance device configured to apply constant gain to an input signal;
a load circuit including:
a first transistor having a first current terminal and a second current terminal, wherein the first current terminal is connected to the output of the transconductance device;
a second transistor having a current terminal connected to a reference voltage, wherein the second current terminal of the first transistor is connected to a control terminal of the second transistor, and wherein the first transistor and second transistor are configured to produce a constant gain in the transconductance device by varying in resistance in inverse proportion to the transconductance of the transconductance device; and
a third transistor configured to operate as a diode, wherein a control terminal of the third transistor is connected to a control terminal of the first transistor.

8. The amplifier of claim 7, including comprising a fourth transistor configured to operate as a diode, wherein a control terminal of the fourth transistor is connected to a current terminal of the third transistor.

9. The amplifier of claim 8, wherein the fourth transistor is connected to provide a path for the flow of current from the third transistor to the reference voltage.

10. The amplifier of claim 7 wherein:
the transconductance device is a P-channel metal oxide semiconductor transistor (MOSFET); and
the first transistor, the second transistor, the third transistor, and the fourth transistor are N-channel MOSFETs.

11. An amplifier input circuit, comprising:
a first transistor; and
a second transistor coupled to the first transistor to form a differential pair; and
a load circuit that connects the first transistor and the second transistor to a reference voltage, the load circuit configured to vary in resistance in inverse proportion to the transconductance of the first transistor and the second transistor, the load circuit including:
a first subcircuit connecting the first transistor to the reference voltage that includes:
a third transistor configured to provide a path for current flow from the first transistor to the reference voltage; and
a fourth transistor, wherein a current terminal of the third transistor is connected to a control terminal of the fourth transistor; and
a second subcircuit connecting the second transistor to the reference voltage that includes:
a fifth transistor configured to provide a path for current flow from the second transistor to the reference voltage; and
a sixth transistor, wherein a current terminal of the fifth transistor is connected to a control terminal of the sixth transistor.

12. The amplifier input circuit of claim 11, including:
a seventh transistor configured to operate as a diode, and
an eighth transistor configured to operate as a diode;
wherein the eighth transistor is configured to provide a path for current flow from the seventh transistor to the reference voltage.

13. The amplifier input circuit of claim 12, wherein:
a control terminal of the seventh transistor is connected to a control terminal of the third transistor; and
a control terminal of the eighth transistor is connected to a current terminal of the seventh transistor.

14. The amplifier input circuit of claim 12, wherein:
a control terminal of the seventh transistor is connected to a control terminal of the fifth transistor; and
a control terminal of the fourth transistor is connected to a control terminal of the sixth transistor.

* * * * *